(12) United States Patent
Head

(10) Patent No.: US 7,665,917 B2
(45) Date of Patent: Feb. 23, 2010

(54) HEAT TREATMENT APPARATUS AND METHODS FOR THERMALLY PROCESSING A SUBSTRATE USING A PRESSURIZED GASEOUS ENVIRONMENT

(75) Inventor: Brian Head, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 391 days.

(21) Appl. No.: 11/693,827

(22) Filed: Mar. 30, 2007

(65) Prior Publication Data

US 2008/0239259 A1 Oct. 2, 2008

(51) Int. Cl.
*G03D 5/00* (2006.01)
(52) U.S. Cl. .................... 396/611; 430/330; 118/733
(58) Field of Classification Search ............... 396/575, 396/611; 355/27, 30; 118/715, 733; 430/330; 374/141
See application file for complete search history.

(56) References Cited

U.S. PATENT DOCUMENTS

| | | | |
|---|---|---|---|
| 5,350,899 | A | 9/1994 | Ishikawa et al. |
| 6,112,595 | A | 9/2000 | Stanke et al. |
| 6,229,116 | B1 | 5/2001 | Shirakawa et al. |
| 6,345,909 | B1 | 2/2002 | Yam |
| 6,575,622 | B2 | 6/2003 | Norrbakhsh et al. |
| 6,597,964 | B1 | 7/2003 | Huang et al. |
| 6,921,456 | B2 | 7/2005 | Biberger et al. |
| 2008/0160462 | A1* | 7/2008 | Herchen et al. ............. 430/330 |

FOREIGN PATENT DOCUMENTS

| | | |
|---|---|---|
| JP | 04319723 A | 11/1992 |
| KR | 20070051646 A | 5/2007 |

OTHER PUBLICATIONS

"Supercritical Fluid", downloaded from http://en.wikipedia.org/wiki/Supercritical_fluid on Sep. 23, 2009.
Gail Kaplan Verbitsky, Examiner, USPTO, Office Action issued in related U.S. Appl. No. 11/833,038 dated as mailed Jul. 10, 2009.

* cited by examiner

*Primary Examiner*—Alan A Mathews
(74) *Attorney, Agent, or Firm*—Wood, Herron & Evans, LLP

(57) ABSTRACT

Apparatus and methods for heating a substrate in a pressurized environment inside of a thermal processing system. The substrate is placed in a gaseous environment inside a processing chamber of the thermal processing system. The substrate is supported in the gaseous environment. The gas pressure inside the processing chamber is increased above atmospheric pressure, which increases the temperature of the gaseous environment. Heat is transferred from the pressurized gaseous environment to the substrate for thermally processing a layer on the substrate.

20 Claims, 3 Drawing Sheets form the latent image pattern into a final image pattern having masked and unmasked areas. Such a series of processing stages is typically carried out in a coating/developing system having discrete heating sections, such as a pre-baking unit and a post-baking unit. Each heating section of the coating/developing system may incorporate a hotplate with a built-in heater of, for example, a resistance heating type.

HEAT TREATMENT APPARATUS AND METHODS FOR THERMALLY PROCESSING A SUBSTRATE USING A PRESSURIZED GASEOUS ENVIRONMENT

FIELD OF THE INVENTION

The invention relates to semiconductor processing and, in particular, to apparatus and methods for thermally processing substrates.

BACKGROUND OF THE INVENTION

Photolithography processes for manufacturing semiconductor devices and liquid crystal displays (LCD's) generally coat a resist on a substrate, expose the resist coating to light to impart a latent image pattern, and develop the exposed resist coating to trans Feature sizes of semiconductor device circuits have been scaled to less than 0.1 micron. Typically, the pattern wiring that interconnects individual device circuits is formed with sub-micron line widths. Consequently, the heat treatment temperature of the resist coating should be accurately controlled to provide reproducible and accurate feature sizes and line widths. The substrates or wafers (i.e., objects to be treated) are usually treated or processed under the same recipe (i.e., individual treatment program) in units (i.e., lots) each consisting of, for example, twenty-five wafers. Individual recipes define heat treatment conditions under which pre-baking and post-baking are performed. Wafers belonging to the same lot are heated under the same conditions.

According to each of the recipes, the heat treatment temperature may be varied within such an acceptable range that the temperature will not have an effect on the final semiconductor device. In other words, a desired temperature may differ from a heat treatment temperature in practice. When the wafer is treated with heat beyond the acceptable temperature range, a desired resist coating cannot be obtained. Therefore, to obtain the desired resist coating, a temperature sensor is used for detecting the temperature of the hotplate. On the basis of the detected temperature, the power supply to the heater may be controlled with reliance on feedback from the temperature sensor. Because the temperature of the entire hotplate is not uniform and varies with the lapsed time, however, it is difficult to instantaneously determine the temperature of the hotplate using a single temperature sensor.

The post exposure bake (PEB) process is a thermally activated process and serves multiple purposes in photoresist processing. First, the elevated temperature of the bake drives the diffusion of the photoproducts in the resist. A small amount of diffusion may be useful in minimizing the effects of standing waves, which are the periodic variations in exposure dose throughout the depth of the resist coating that result from interference of incident and reflected radiation. Another main purpose of the PEB is to drive an acid-catalyzed reaction that alters polymer solubility in many chemically amplified resists. PEB also plays a role in removing solvent from the wafer surface.

Chemical amplification allows a single photoproduct to cause many solubility-switching reactions, thus increasing the sensitivity of these photoresist systems. Some amount of acid transport is necessary in that it allows a single acid to move to many reactive polymer sites. However, acid transport from nominally exposed to unexposed regions can complicate control of resist feature dimensions. Acid transport through these reactive systems is mechanistically complex. Measurements have shown that there is a very large difference in acid mobility between the starting material, which is reactive towards acid, and the product material, which is no longer reactive.

In addition to the intended results, numerous problems may be observed during heat treatment. For example, the light sensitive component of the resist may decompose at temperatures typically used to remove the solvent, which is a concern for a chemically amplified resist because the remaining solvent content has a strong impact on the diffusion and amplification rates. Also, heat-treating can affect the dissolution properties of the resist and, thus, have direct influence on the developed resist profile.

Hot plates having uniformities within a range of a few tenths of a degree centigrade are currently available and are generally adequate for current process methods. Hotplates are calibrated using a flat bare silicon wafer with imbedded thermal sensors. However, actual production wafers carrying deposited films on the surface of the silicon may exhibit small amounts of warpage because of the stresses induced by the deposited films. This warpage may cause the normal gap between the wafer and the hot plate, often referred to as a proximity gap, to vary across the wafer from a normal value of approximately 100 µm by as much as a 100 µm deviation from the mean proximity gap. Consequently, actual production wafers may have different heating profiles than the wafer used to calibrate the hotplate.

This variability in the proximity gap changes the heat transfer characteristics in the area of the varying gap causing temperature non-uniformity on the wafer surface. This temperature difference may result in a change in critical dimension (CD) in that area of several nanometers, which can approach the entire CD variation budget for current leading edge devices, and will exceed the projected CD budget for smaller devices planned for production in the next few years.

What is needed, therefore, are apparatus and methods for heating a substrate during a thermal processing system that are tolerant variances in the proximity gap.

SUMMARY OF THE INVENTION

In an embodiment, a method for heating a substrate in the gaseous environment inside the processing chamber may comprise supporting the substrate in the gaseous environment inside the processing chamber and pressurizing the gaseous environment to a process pressure above atmospheric pressure. The increased pressure causes the gaseous environment to be heated, which in turn heats a layer carried on the substrate to a process temperature. This is accomplished by transferring heat energy from the pressurized gaseous environment to the layer for a time effective to change a property of the layer.

In another embodiment, a heat treatment apparatus is provided for heating a substrate. The heat treatment apparatus may comprise a processing chamber containing a process space, a substrate support configured to support the substrate in the process space, and a gas supply. The processing chamber includes an inlet communicating with a gaseous environment filling the process space. The gas supply is coupled with the inlet. The gas supply is adapted to introduce a stream of compressed gas into the process space through the inlet so as to pressurize the gaseous environment in the process space above atmospheric pressure.

BRIEF DESCRIPTION OF THE FIGURES

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Figure 1:
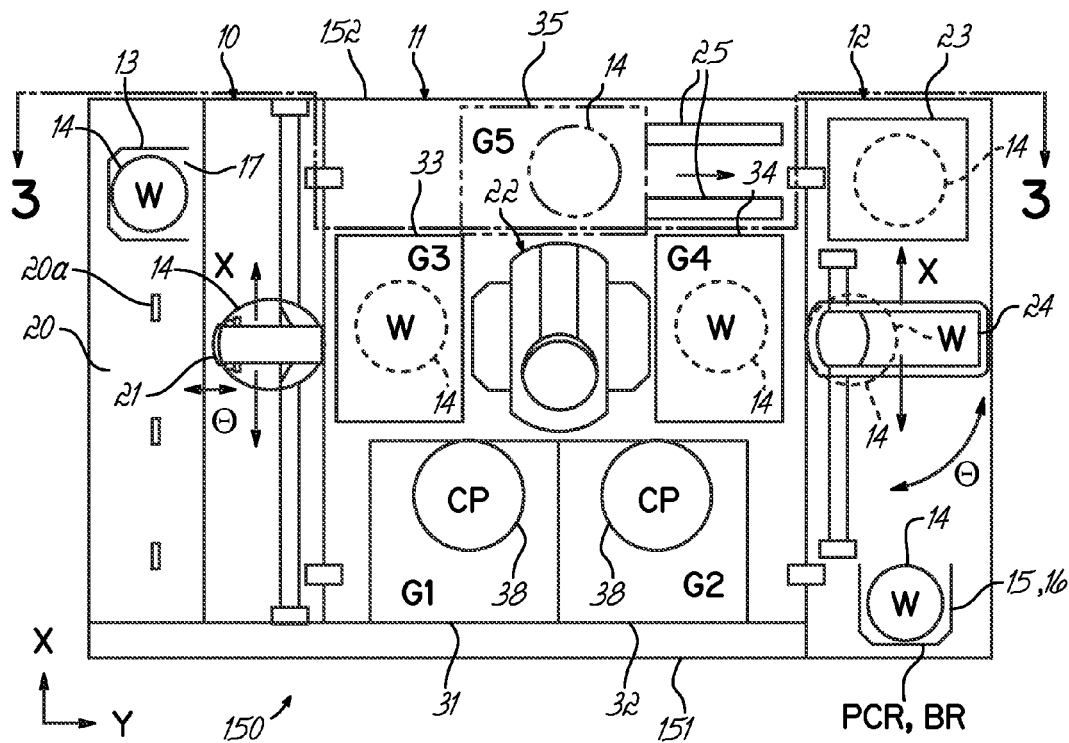
FIG. 1 is a top view of a schematic diagram of a coating/developing system for use in association with the embodiments of the invention.
Figure 2:
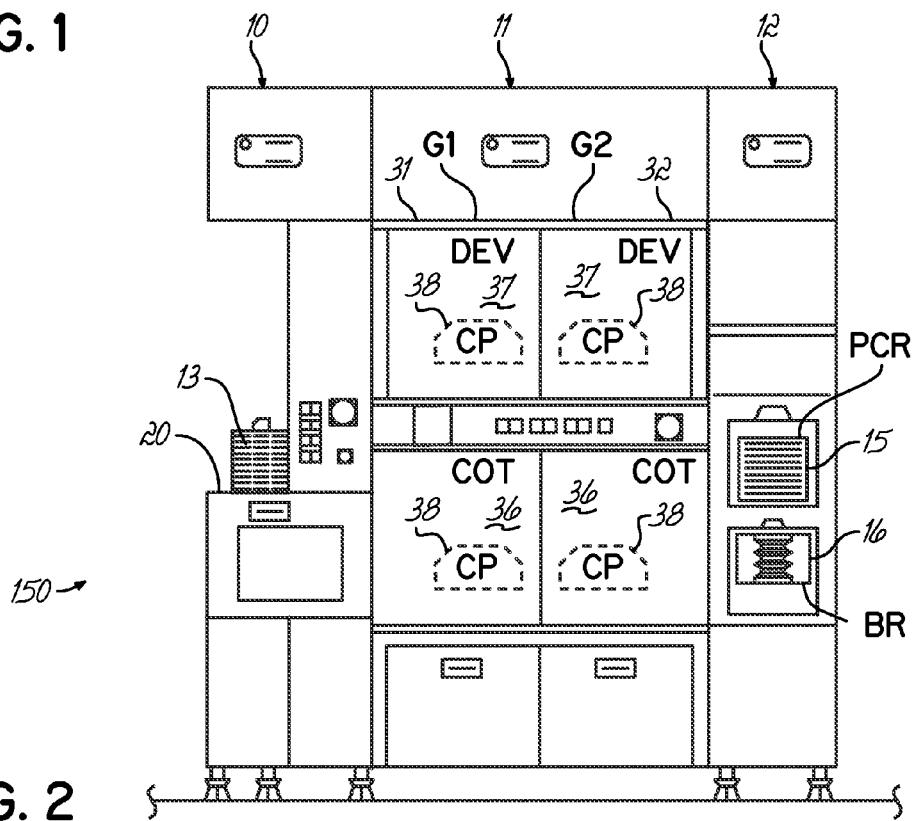
FIG. 2 is a front view of the coating/developing system of FIG. 1.
Figure 3:
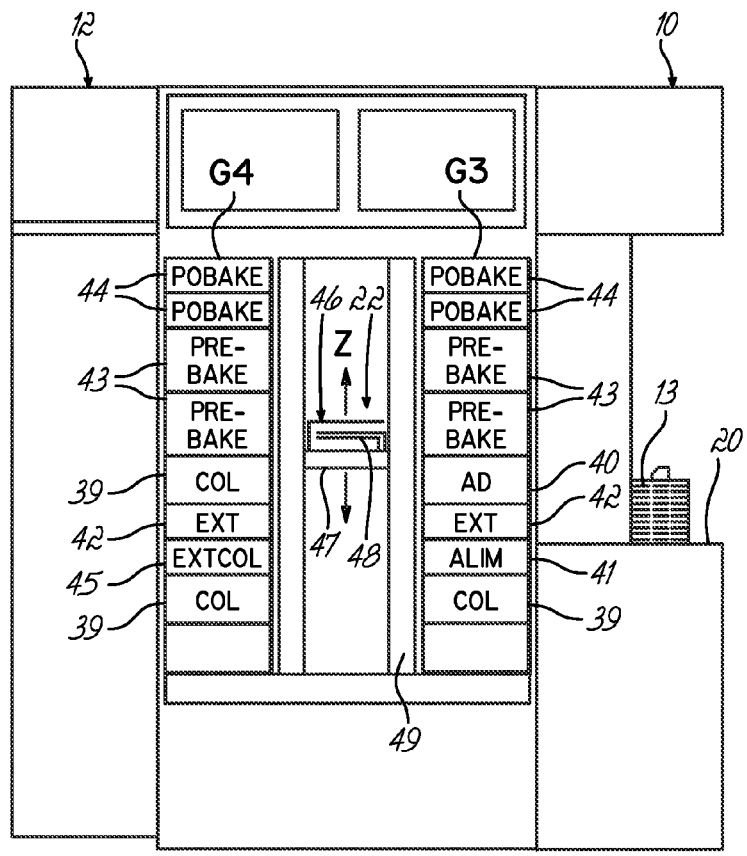
FIG. 3 is a partially cut-away back view of the coating/developing system of FIG. 1.

With reference to FIGS. 1-3, a coating/developing process system 150 comprises a cassette station 10, a process station 11, and an interface section 12, which are contiguously formed as one unit. In the cassette station 10, a cassette (CR) 13 storing a plurality of substrates represented by wafers (W) 14 (e.g., 25 wafers) is loaded into, and unloaded from, the system 150. The process station 11 includes various single-wafer processing units for applying a predetermined treatment required for a coating/developing step to individual wafers (W) 14. These process units are arranged in predetermined positions of multiple stages, for example, within first (G1), second (G2), third (G3), fourth (G4) and fifth (G5) multiple-stage process unit groups 31, 32, 33, 34, 35. The interface section 12 delivers the wafers (W) 14 between the process station 11 and an exposure unit (not shown) that can be abutted against the process station 11.

A cassette table 20 of cassette station 10 has positioning-projections 20a on which a plurality of wafer cassettes (CR) 13 (for example, at most 6) is mounted. The wafer cassettes (CR) 13 are thereby aligned in line in the direction of an X-axis (the up-and-down direction of FIG. 1) with a wafer inlet/outlet 17 facing the process station 11. The cassette station 10 includes a wafer transfer carrier 21 movable in the aligning direction (X-axis) of cassettes 13 and in the aligning direction (Z-axis, vertical direction) of wafers 14 stored in the wafer cassette (CR) 13. The wafer transfer carrier 21 gains access selectively to each of the wafer cassettes (CR) 13.

The wafer transfer carrier 21 is further designed rotatable in a Θ (theta) direction, so that it can gain access to an alignment unit (ALIM) 41 and an extension unit (EXT) 42 belonging to a third multiple-stage process unit group (G3) 33 in the process station 11, as described later.

The process station 11 includes a main wafer transfer mechanism 22 (movable up-and-down in the vertical direction) having a wafer transfer machine 46. All process units are arranged around the main wafer transfer mechanism 22, as shown in FIG. 1. The process units may be arranged in the form of multiple stages G1, G2, G3, G4 and G5.

The main wafer transfer mechanism 22 has a wafer transfer machine 46 that is movable up and down in the vertical direction (Z-direction) within a hollow cylindrical supporter 49, as shown in FIG. 3. The hollow cylindrical supporter 49 is connected to a rotational shaft of a motor (not shown). The cylindrical supporter 49 can be rotated about the shaft synchronously with the wafer transfer machine 46 by the driving force of the motor rotation. Thus, the wafer transfer machine 46 is rotatable in the Θ direction. Note that the hollow cylindrical supporter 49 may be connected to another rotational axis (not shown), which is rotated by a motor.

The wafer transfer machine 46 has a plurality of holding members 48 which are movable back and forth on a table carrier 47. The wafer (W) 14 is delivered between the process units by the holding members 48.

In the process unit station 11 of this embodiment, five process unit groups G1, G2, G3, G4, and G5 can be sufficiently arranged. For example, first (G1) and second (G2) multiple-stage process unit groups 31, 32 are arranged in the front portion 151 (in the forehead in FIG. 1) of the system 150. A third multiple-stage process unit group (G3) 33 is abutted against the cassette station 10. A fourth multiple-stage process unit group (G4) is abutted against the interface section 12. A fifth multiple-stage process unit group (G5) can be optionally arranged in a back portion 152 of system 150.

As shown in FIG. 2, in the first process unit group (G1) 31, two spinner-type process units, for example, a resist coating unit (COT) 36 and a developing unit (DEV) 37, are stacked in the order mentioned from the bottom. The spinner-type process unit used herein refers to a process unit in which a predetermined treatment is applied to the wafer (W) 14 mounted on a spin chuck (not shown) placed in a cup (CP) 38. Also, in the second process unit group (G2) 32, two spinner process units, such as a resist coating unit (COT) 36 and a developing unit (DEV) 37, are stacked in the order mentioned from the bottom. It is preferable that the resist coating unit (COT) 36 be positioned in a lower stage from a structural point of view and to reduce maintenance time associated with the resist-solution discharge. However, if necessary, the coating unit (COT) 36 may be positioned in the upper stage.

As shown in FIG. 3, in the third process unit group (G3) 33, open-type process units, for example, a cooling unit (COL) 39 for applying a cooling treatment, an alignment unit (ALIM) 41 for performing alignment, an extension unit (EXT) 42, an adhesion unit (AD) 40 for applying an adhesion treatment to increase the deposition properties of the resist, two pre-baking units (PREBAKE) 43 for heating a wafer 14 before light-exposure, and two post-baking units (POBAKE) 44 for heating a wafer 14 after light exposure, are stacked in eight stages in the order mentioned from the bottom. The open type process unit used herein refers to a process unit in which a predetermined treatment is applied to a wafer 14 mounted on a support platform within one of the processing units. Similarly, in the fourth process unit group (G4) 34, open type process units, for example, a cooling unit (COL) 39, an extension/cooling unit (EXTCOL) 45, an extension unit (EXT) 42, another cooling unit (COL), two pre-baking units (PREBAKE) 43 and two post-baking units (POBAKE) 44 are stacked in eight stages in the order mentioned from the bottom.

Because the process units for low-temperature treatments, such as the cooling unit (COL) 39 and the extension/cooling unit (EXTCOL) 45, are arranged in the lower stages and the process units for higher-temperature treatments, such as the pre-baking units (PREBAKE) 43 and the post-baking units (POBAKE) 44 and the adhesion unit (AD) 40 are arranged in the upper stages in the aforementioned unit groups, thermal interference between units can be reduced. Alternatively, these process units may be arranged differently.

The interface section 12 has the same size as that of the process station 11 in the X direction but shorter in the width direction. A movable pickup cassette (PCR) 15 and an unmovable buffer cassette (BR) 16 are stacked in two stages in the front portion of the interface section 12, an optical edge bead remover 23 is arranged in the back portion, and a wafer carrier 24 is arranged in the center portion. The wafer carrier 24 moves in the X- and Z-directions to gain access to both cassettes (PCR) 15 and (BR) 16 and the optical edge bead remover 23. The wafer carrier 24 is also designed rotatable in the Θ direction; so that it can gain access to the extension unit (EXT) 42 located in the fourth multiple-stage process unit group (G4) 34 in the process station 11 and to a wafer deliver stage (not shown) abutted against the exposure unit (not shown).

In the coating/developing process system 150, the fifth multiple-stage process unit group (G5, indicated by a broken line) 35 is designed to be optionally arranged in the back portion 152 at the backside of the main wafer transfer mechanism 22, as described above. The fifth multiple-stage process unit group (G5) 35 is designed to be shifted sideward along a guide rail 25 as viewed from the main wafer transfer mechanism 22. Hence, when the fifth multiple-stage process unit group (G5) 35 is positioned as shown in FIG. 1, a sufficient space is obtained by sliding the fifth process unit group (G5) 35 along the guide rail 25. As a result, a maintenance operation to the main wafer transfer mechanism 22 can be easily carried out from the backside. To maintain the space for maintenance operation to the main wafer transfer mechanism 22, the fifth process unit group (G5) 35 may be not only slid linearly along the guide rail 25 but also shifted rotatably outward in the system.

The baking process performed by the adhesion unit (AD) 40 is not as sensitive to warpage of the wafer 14 as are the pre- and post-bake processes performed by the pre-baking units (PREBAKE) 43 and the post-baking units (POBAKE) 44. Therefore, the adhesion unit (AD) 40 may continue to utilize a hotplate in the heat treatment apparatus, as disclosed in U.S. Pat. No. 7,101,816 to Kaushal et al. ("Kaushal"), which is hereby incorporated by reference herein in its entirety. Nevertheless, in embodiments of the invention, the adhesion unit (AD) 40 may also utilize any of the embodiments of the heat treatment apparatus described below.

Figure 5A:
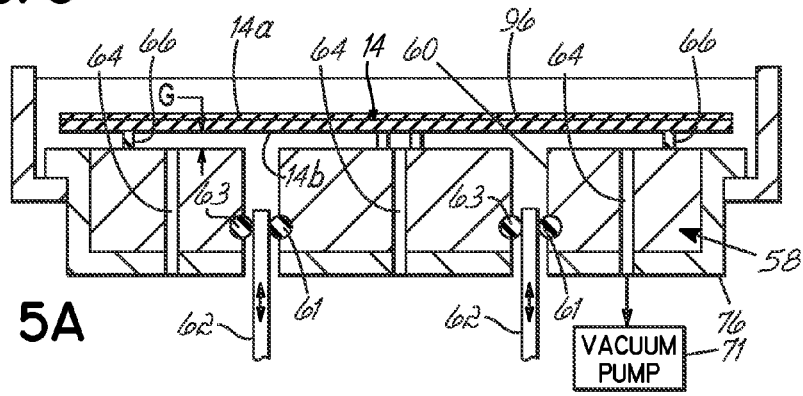
FIG. 5A is a detailed view of a portion of FIG. 5.
Figure 5B:
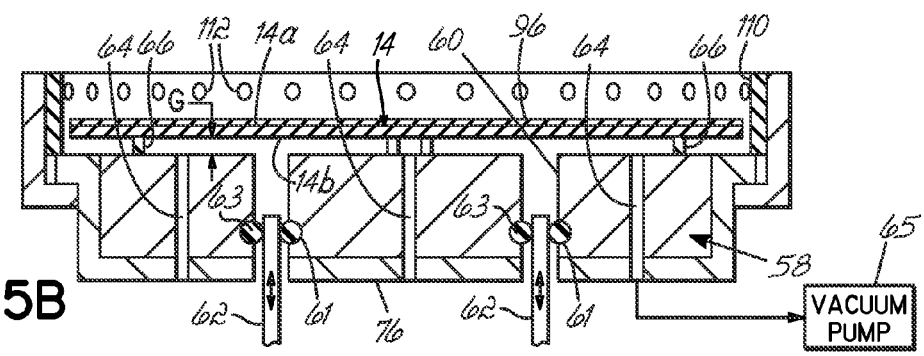
FIG. 5B is a detailed view similar to FIG. 5A in accordance with an alternative embodiment.
Figure 4:
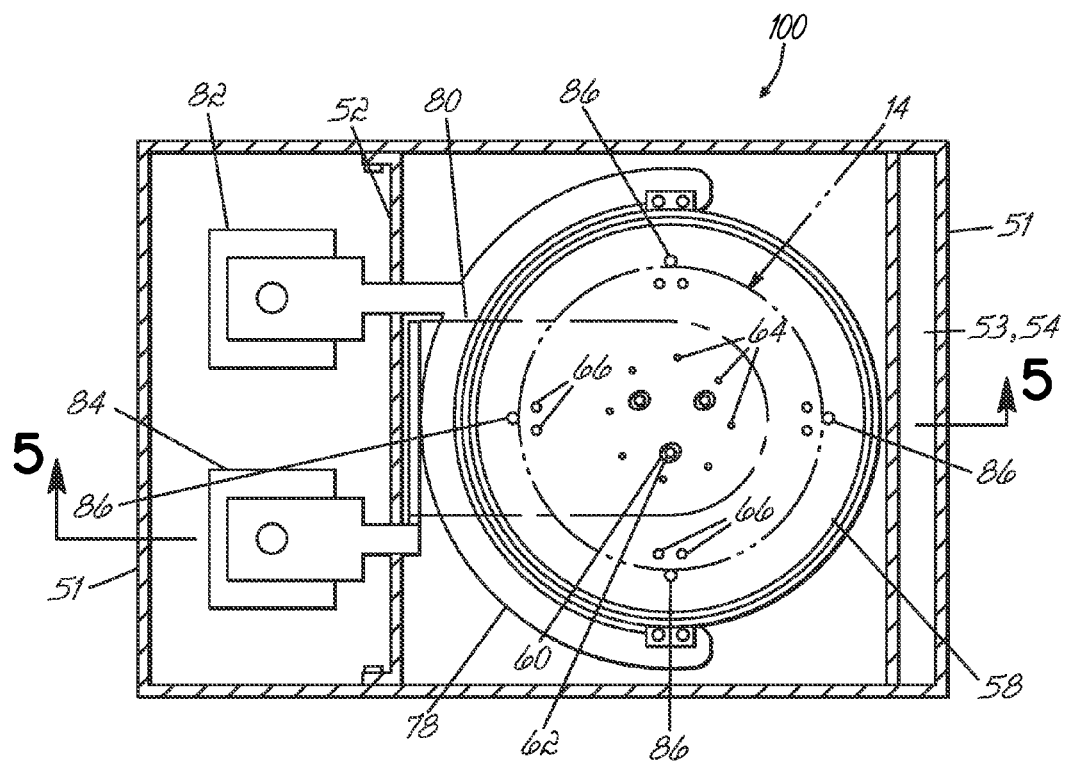
FIG. 4 is a top plan view of a heat treatment apparatus of FIG. 3 for use with the coating/developing system of FIGS. 1-3.
Figure 5:
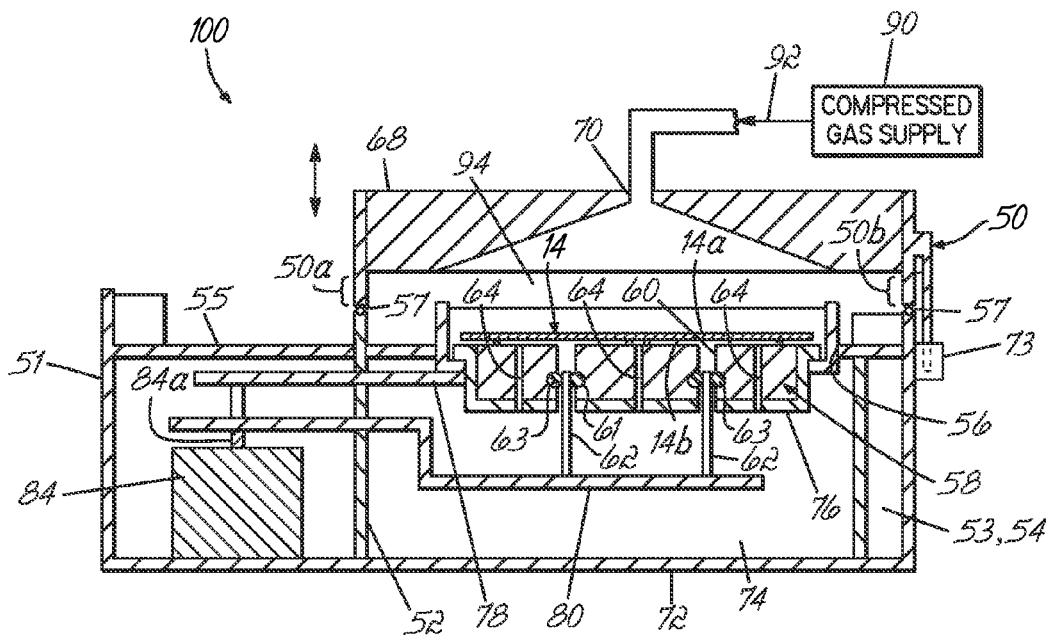
FIG. 5 is a cross-sectional view taken generally along line 5-5 in FIG. 4.

With reference to FIGS. 4, 5 and 5A, a heat treatment apparatus 100 includes a processing chamber 50 with a base 51 having a sidewall 52 and a shielding plate 55 intersecting the sidewall 52, and a lid 68. The lid 68 and base 51 collectively define a process chamber, when the lid 68 is sealed with the base 51, that encloses a process space 94 containing a gaseous environment. The heat treatment apparatus 100 may be suitable for use as the pre-baking unit (PREBAKE) 43 and the post-baking unit (POBAKE) 44 of the thermal or coating/developing process system 150. The heat treatment apparatus 100 is adapted to heat wafers 14 to process temperatures above room temperature by pressurizing the gaseous environment to which the wafers 14 are exposed inside the process space 94.

Disposed in the processing chamber 50 is a support surface 58 with passageways 60. Lift pins 62 are disposed in and aligned with the passageways 60. The lift pins 62 are moveable between a first lowered position where the pins are flush or below an upper surface of the support surface 58 to a second lifted position where the lift pins project above the upper surface of the support surface 58. The lift pins 62 are connected to and supported by a lift pin arm 80, which is further connected to and supported by a rod 84a of a hydraulic cylinder 84. When the rod 84a is actuated to extend from the hydraulic cylinder 84, the lift pins 62 project beyond the support surface 58, thereby lifting the wafer 14 above the support surface 58.

As best shown in FIG. 5A, each of the passageways 60 includes a ring-shaped groove 61 in a sidewall surrounding each passageway 60 and a seal member 63 in the groove 61 that creates a pressure seal between one of the lift pins 62 and its respective passageway 60. The seal members 63 prevent or significantly restrict the escape of gas from the gaseous environment inside the process space 94 when the processing chamber 50 is pressurized and the lift pins 62 are retracted into the support surface 58. Alternatively, each of the lift pins 62 may carry a seal member (not shown) that provides a seal with the corresponding passageway 60 as a substitute for seal members 63. In yet another alternative embodiment, the boundary of the processing chamber 50 may be enlarged to encompass the lift pin arm 80, rod 84a, and hydraulic cylinder 84, thereby eliminating the need to provide seal members 63 between the lift pins 62 and passageways 60.

The lid 68 is moveable from a first open position in which the lid 68 is separated from the base 51 to a second closed position where lid 68 extends down to meet the sidewall 52 and the base 51 creating an enclosed volume. A sealing member have the representative form of an O-ring 57 is positioned on either the sidewall 52 or the lid 68 and may assist in sealing the processing chamber 50 when the lid 68 is in the second closed position. While an O-ring 57 is utilized in this embodiment, any number of sealing components may be used at the interface between the lid 68 and the sidewall 52 as long as the seal is sufficient to withstand pressurization of the processing chamber 50 to the pressures necessary to elevate the temperature of the gaseous atmosphere or environment inside the process space 94 to a temperature sufficient to heat the wafer 14 and a layer 96 of processable material to process temperatures. When the lid 68 is in the first open position, wafer 14 may be loaded into and unloaded from the processing chamber 50 through gaps 50a, 50b which are formed at a front surface side (aisle side of the main wafer transfer mechanism 22) and a rear surface side of the processing chamber 50, respectively.

Pressurization of the gaseous environment of the process space 94 inside the processing chamber 50 may be the exclusive source of heat energy. Following the ideal gas law:

$$PV = nRT \tag{1}$$

For a constant volume (V) of a gas, the ratios of pressure to temperature are equal:

$$\frac{P}{T} = \frac{nR}{V} \tag{2}$$

$$\frac{P_1}{T_1} = \frac{nR}{V} \text{ and } \frac{P_2}{T_2} = \frac{nR}{V} \tag{3}$$

therefore, $$\frac{P_1}{T_1} = \frac{P_2}{T_2} \tag{4}$$

where $T_1$ is the initial temperature of the gaseous environment in process space 94 when the wafer 14 is placed in the processing chamber 50, $T_2$ is the desired temperature of the gaseous environment inside process space 94 for processing the wafer 14, and $P_1$ is the initial pressure of the gaseous environment inside process space 94. The initial temperature, $T_1$, may be about room temperature and the initial pressure, $P_1$, may be atmospheric pressure of about 1 atmosphere. Solving equation (4) for the pressure, $P_2$, to produce the desired temperature, $T_2$, of the gaseous environment in process space 94:

$$P_2 = \frac{P_1 T_2}{T_1} \quad (5)$$

To heat the gaseous environment inside process space 94 to a temperature between about 90° C. and about 130° C. for processing without the addition of heat energy from an external source, the pressure of the gaseous environment in the processing chamber 50 may be increased to a pressure range of about 4 atmospheres to about 5 atmospheres. Heat energy is transferred from the gaseous environment in process space 94 to the wafer 14 until the process temperature of the layer 96 carried on the wafer 14 and the temperature of the wafer 14 are substantially equilibrated with the temperature of the gaseous environment in process space 94. The wafer 14 and the layer 96 are maintained at the processing temperature for the time appropriate for the thermal process and then the processing chamber 50 is depressurized.

A circular opening 56 is formed at the center of the horizontal shielding plate 55. The support surface 58 is housed in the opening 56. The horizontal shielding plate 55 with the aid of a supporting plate 76 supports the support surface 58.

Referring now to FIG. 5, when the wafer 14 is positioned on the support surface 58, the lid 68 is lowered to the second closed position to make contact with the sidewall 52 and the base 51. The lid 68 is held in contact with the sidewall 52 and the base 51 by a locking mechanism 73, which seals the processing chamber 50. The locking mechanism 73 may be a mechanical locking device as illustrated in this embodiment, or in an alternate embodiment, the locking mechanism may be a vacuum system that draws the lid 68 down to the sidewall 52 and the base 51 and then maintains the contact with the vacuum lock during the pressurization of the gaseous environment in the process space 94 inside the processing chamber 50. In still other embodiments, the locking mechanism 73 may employ both the vacuum system to draw the lid 68 down and a mechanical locking device to maintain contact when the processing chamber 50 is pressurized.

A compressed gas supply 90, which is coupled with the inlet port 70, may be used to introduce compressed air or a compressed gas, as diagrammatically indicated by single headed arrow number 92, into the processing chamber 50. The compressed air or gas introduced through the inlet port 70 in the lid 68 operates to increase the pressure of the gaseous environment in process space 94. Based then upon the ideal gas law, as explained above, the temperature of the gaseous environment in process space 94 increases as the pressure of the gaseous environment in process space 94 increases. The compressed gas supply 90 may comprise a compressor having a construction that is capable of compressing the air or other gas, as understood by a person having ordinary skill in the art. In an alternate embodiment, a compressed gas may be introduced through the inlet port 70 as a regulated or metered flow from a consumable fixed volume of compressed air or gas contained in a gas cylinder or container rather than using a compressor to compress the air or other gas.

The wafers 14 carry a layer 96 of processable material, such as resist. The layer 96 contains a substance that is volatized and released at the process temperature. The resist coating unit (COT) 36 is used to apply the layer 96 of resist that is thermally processed by the heat treatment apparatus 100 at the process temperature. This volatile substance evaporates off of the wafer 14 when the layer 96 is exposed to the heat energy contained in the gaseous environment in process space 94 at temperatures sufficient to heat the wafer 14 and layer 96 to process temperatures. The waste product produced by this evaporation may need to be removed from the gaseous environment inside process space 94 and the processing chamber 50.

With continued reference to FIGS. 4, 5 and 5A, small exhaust ports 64 through the support surface 58 communicate with an outlet port (not shown). Waste product generated from the layer 96 on the surface of the wafer 14 during the baking process may be exhausted through the exhaust ports 64 and vented from the pressurized gaseous environment in the process space 94 inside processing chamber 50 via the outlet port to a vacuum pump 65, or other evacuation unit, that can be throttled to regulate the venting rate. The venting occurs simultaneously with a continuous supply of fresh pressurized gas through the inlet port 70 in the processing chamber 50 at an introduction rate that maintains the pressure of the gaseous environment inside process space 94 substantially constant. Of course, the exhaust ports 64 are optional if the processable material lacks a volatile substance or contains a minor amount of the volatile substance that can be tolerated when baking wafer 14.

In an alternate embodiment and as best seen in the detailed view of FIG. 5B, a ring-form shutter 110 may be attached to the outer periphery of the support surface 58. Injection openings 112 are formed along the periphery of the shutter 110 at constant or varying intervals of central angles. The injection openings 112 communicate with a cooling gas supply source (not shown). The shutter 110 may be liftably supported by a hydraulic cylinder 82 via a shutter arm 78 (FIG. 4). When the shutter 110 is raised, a cooling gas, such as nitrogen gas or air, is exhausted from the injection openings 112, which is used to drop the temperature below the reaction temperature quickly while the wafer 14 is waiting to be picked up and moved to the next stage of processing. In other embodiments, a cooling arm (not shown) may be attached to a cooling plate (not shown) that moves in when the wafer 14 is finished processing. The wafer 14 then sits on the cooling plate until it is moved to the next stage of processing. The cooling plate may be cooled by chilled water.

A compartment 74 defined by the shielding plate 55, two sidewalls 53, and a bottom plate 72 is formed below the horizontal shielding plate 55. Supporting plate 76, shutter arm 78, lift pin arm 80, and hydraulic cylinders 82, 84 are arranged in the compartment 74. In another embodiment, the lid 68 is extended to enclose the entire heat treatment apparatus, pressurizing compartment 74 simultaneously with the processing chamber 50. Sealing the passageways 60 in which the lift pins 62 reside may be optional for this embodiment.

With reference to FIGS. 4 and 5A, projections 86 are formed on an upper surface of the support surface 58 for accurately positioning the wafer 14. In addition, smaller projections, referred to as proximity pins 66, are formed on the upper surface of the support surface 58. When the wafer 14 is delivered to the support surface 58, top portions the proximity pins 66 contact the backside 14b of the wafer 14 and elevate the wafer 14 above the support surface. The gap, G, created is sufficient to expose the backside 14b of the wafer 14 to the elevated temperatures of the pressurized gaseous environment inside process space 94. The gap, G, also prevents the backside 14*b* of the wafer 14 from contacting any surface of the processing chamber 50, thus avoiding any strain or damage to the wafer 14.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed is:

1. A method for thermally processing a layer carried on a substrate in a gaseous environment inside a processing chamber of a thermal processing system, the method comprising:
   supporting the substrate in the gaseous environment inside the processing chamber;
   pressurizing the gaseous environment to a process pressure above atmospheric pressure to cause the gaseous environment to be heated;
   transferring heat energy from the gaseous environment to the substrate and the layer for heating the layer to a process temperature; and
   thermally processing the layer at the process temperature for a time effective to change a property of the layer.

2. The method of claim 1 further comprising:
   generating a waste product when the layer carried on the substrate is heated to the process temperature; and
   at least partially removing the waste product from the heated gaseous environment inside the processing chamber.

3. The method of claim 2 wherein at least partially removing the waste product further comprises:
   venting the pressurized gaseous environment to a location outside of the processing chamber to remove amounts of the waste product; and
   introducing amounts of a fresh gas into the processing chamber, while venting, at an introduction rate sufficient to maintain the pressurized gaseous environment at or near the process pressure.

4. The method of claim 2 wherein the layer comprises a processable material containing a substance that is volatile at the process temperature, and generating the waste product further comprises:
   exposing the layer to the pressurized gaseous environment to heat the layer to the process temperature; and
   volatizing and releasing amounts of the substance from the processable material when the layer is heated to the process temperature.

5. The method of claim 1 wherein supporting the substrate further comprises:
   holding the substrate inside the processing chamber such that a top surface and a backside of the substrate are exposed to the pressurized gaseous environment.

6. The method of claim 5 wherein the processing chamber further comprises a substrate support in the gaseous environment, and holding the substrate further comprises:
   elevating the substrate above the support surface by a gap sufficient to expose the backside of the substrate to the pressurized gaseous environment.

7. The method of claim 6 wherein heating the layer further comprises:

heating the layer carried on the substrate without transferring heat from the support surface to the pressurized gaseous environment in the gap.

8. The method of claim 1 wherein heating the layer further comprises:
   heating the layer carried on the substrate while transferring negligible amounts of heat energy from the processing chamber to the pressurized gaseous environment.

9. The method of claim 1 wherein heating the layer further comprises:
   heating the layer carried on the substrate without transferring heat energy from the processing chamber to the pressurized gaseous environment.

10. The method of claim 1 wherein the process temperature ranges from about 90° C. to about 130° C., and heating the layer further comprises:
    heating the layer carried on the substrate to the process temperature ranging from about 90° C. and about 130° C.

11. The method of claim 1 wherein heating the layer further comprises:
    substantially equilibrating the process temperature of the layer and a gas temperature of the gaseous environment proximate to the layer and the substrate.

12. The method of claim 1 wherein the gaseous environment comprises compressed gas, and pressurizing the gaseous environment further comprises:
    compressing the gas to generate a stream of compressed gas; and
    directing the stream of compressed into the processing chamber.

13. The method of claim 1 wherein the gaseous environment comprises compressed gas, and pressurizing the gaseous environment further comprises:
    supplying gas from a compressed gas supply to generate a stream of compressed gas; and
    directing the stream of compressed gas into the processing chamber.

14. The method of claim 1 wherein the layer comprises a resist, and thermally processing the layer further comprises:
    modifying the resist layer at the process temperature for a time effective to change a property of the resist.

15. A heat treatment apparatus for heating a substrate, the heat treatment apparatus comprising:
    a processing chamber containing a process space, the processing chamber including an inlet communicating with a gaseous environment inside the process space;
    a substrate support configured to support the substrate in the process space; and
    a gas supply coupled with the inlet, the gas supply adapted to introduce a stream of compressed gas into the process space through the inlet so as to pressurize the gaseous environment inside the process space in a range of about 4 atmospheres to about 5 atmospheres such that the compressed gas is heated to a temperature between about 90° C. and about 130° C. without the addition of heat energy from an external source.

16. The heat treatment apparatus of claim 15 wherein the gas supply further comprises:
    a compressor configured to compress a gas to form the stream of compressed gas that is introduced into the process space.

17. The heat treatment apparatus of claim 15 wherein the gas supply further comprises:
    a compressed gas container configured to contain a fixed volume of compressed gas that is introduced into the process space as the stream of compressed gas.

18. The heat treatment apparatus of claim 15 wherein the substrate support includes a support surface and a plurality of passageways in the support surface that are positioned to underlie the substrate, and further comprising:
- a plurality of lift pins each disposed in a respective one of the passageways, the lift pins moveable relative to the substrate support between first and second positions in which the substrate has different separations relative to the support surface; and
- a plurality of seal members each disposed within a respective one of the passageways, each of the seal members forming a pressure seal with the respective one of the passageways when the lift pins are moved to at least one of the first and second positions.

19. The heat treatment apparatus of claim 18 wherein each of the passageways includes a groove that receives a respective one of the seal members.

20. The heat treatment apparatus of claim 15 wherein the substrate support includes at least one vent, and further comprising:
- a vacuum pump coupled with the at least one vent, the vacuum pump operative for evacuating the pressurized gaseous environment to a location outside of the processing chamber to remove amounts of the waste product.

* * * * *

UNITED STATES PATENT AND TRADEMARK OFFICE
CERTIFICATE OF CORRECTION

| | | |
|---|---|---|
| PATENT NO. | : 7,665,917 B2 | Page 1 of 1 |
| APPLICATION NO. | : 11/693827 | |
| DATED | : February 23, 2010 | |
| INVENTOR(S) | : Brian Head | |

It is certified that error appears in the above-identified patent and that said Letters Patent is hereby corrected as shown below:

In column 2, line 45, before "variances", insert --of--.

In column 6, line 26, change "have" to --having--.

In column 8, line 62, after "portions", insert --of--.

In column 10, Claim 12, line 30, after "compressed", insert --gas--.

Signed and Sealed this

Fifteenth Day of June, 2010

David J. Kappos
*Director of the United States Patent and Trademark Office*